United States Patent [19]

Smith, Jr. et al.

[11] Patent Number: 5,452,224

[45] Date of Patent: Sep. 19, 1995

[54] METHOD OF COMPUTING MULTI-CONDUCTOR PARASITIC CAPACITANCES FOR VLSI CIRCUITS

[75] Inventors: William R. Smith, Jr., Laguna Niguel; Richard A. Brodie, Oceanside, both of Calif.; Michael W. Beaven, West Lafayette, Ind.

[73] Assignee: Hughes Aircraft Company, Los Angeles, Calif.

[21] Appl. No.: 926,977

[22] Filed: Aug. 7, 1992

[51] Int. Cl.⁶ .............................................. G06F 15/60
[52] U.S. Cl. .................................. 364/488; 364/490; 395/921
[58] Field of Search ............... 364/488, 489, 490, 491, 364/578; 324/686, 687; 395/919, 920, 921, 922; 307/303.1; 250/492.2

[56] References Cited

U.S. PATENT DOCUMENTS

| | | | |
|---|---|---|---|
| 4,109,029 | 8/1978 | Ozdemir et al. | 250/492.2 |
| 4,132,898 | 1/1979 | Buelow et al. | 250/492.3 |
| 4,554,625 | 11/1985 | Otten | 364/148 |
| 4,805,113 | 2/1989 | Ishii et al. | 364/491 |
| 4,823,278 | 4/1989 | Kikuchi et al. | 364/491 |
| 4,835,705 | 5/1989 | Fujino et al. | 364/491 |
| 4,852,015 | 7/1989 | Doyle, Jr. | 364/491 |
| 4,939,681 | 7/1990 | Yokomizo et al. | 364/578 |
| 4,975,854 | 12/1990 | Yabe | 364/491 |
| 4,978,633 | 12/1990 | Seefeldt et al. | 364/491 |
| 5,062,054 | 10/1991 | Kawakami et al. | 364/491 |
| 5,166,888 | 11/1992 | Engeike | 364/491 |
| 5,175,693 | 12/1992 | Kurosawa | 364/491 |
| 5,179,525 | 1/1993 | Griffis et al. | 364/578 |
| 5,187,668 | 2/1993 | Okude et al. | 364/491 |
| 5,197,015 | 3/1993 | Hartoog et al. | 364/490 |

OTHER PUBLICATIONS

Ruehli, Albert E. and Pierce A. Brennan, "Efficient Capacitance Calculations for Three-Dimensional Multiconductor Systems", IEEE Trnasactions on Microwave Theory and Techniques, vol. MTT-21, No. 2, Feb. 1973, pp. 76-82.

Sedgewick, Robert, "Algorithms", Aug. 1984, pp. 312-317, Addison-Wesley Publishing Company, Inc.

Janak, James F. and David D. Ling et al., "C3DSTAR: A 3D Wiring Capacitance Calculator", ICCAD-89 Digest (Nov. 1989), pp. 530-533.

van der Meijs, N. P. and A. J. van Genderen, "An Efficient Finite Element Method for Submicron IC Capacitance Extraction", 1989 26th ACM/IEEE Design Automation Conference, Paper 40.2, pp. 678-681.

Yoshida et al, "Panamap-B: A Mask Verification System For Bipolar IC", IEEE 1981, pp. 690-695.

McCormick, "EXCL: A Circuit Extractor For IC Designs" IEEE 1984, pp. 616-623.

*Primary Examiner*—Kevin J. Teska
*Assistant Examiner*—Tan Nguyen
*Attorney, Agent, or Firm*—Hugh P. Gortler; Michael W. Sales; Wanda K. Denson-Low

[57] ABSTRACT

A method of computing parasitic capacitances between multiple electrical conductors within an electric circuit computes a division of the circuit's physical layout into a plurality of windows. The parasitic capacitances associated with the conductors of each window are computed, and the results for the various windows combined into a matrix of parasitic capacitances for the overall circuit. The windows are preferably overlapped, with the capacitance values for conductor pairs located in more than one window averaged. Complex polygons are fractured into simpler shapes by extending a ray from a vertex of the polygon to intersect an opposed segment, and defining the peripheries of the simpler elements as comprising the ray and respective different portions of the original polygon's periphery. Rays may be extended in a x,y pattern from multiple vertices of the polygon until a ray is located that extends through the polygon's interior, with the fracturing performed along that ray. Fracturing preferably continues until all of the elements are reduced to Manhattan-oriented rectangles or triangles. Where one element overlaps another element in another plane, fracturing is performed along a projection of the overlapping edge on the second element to reduce inaccuracies in the approximated charge density on the overlapped element.

29 Claims, 8 Drawing Sheets

METHOD OF COMPUTING MULTI-CONDUCTOR PARASITIC CAPACITANCES FOR VLSI CIRCUITS

BACKGROUND OF THE INVENTION

1. Field of the Invention

This invention relates to methods for calculating the parasitic capacitances between conductors of an integrated circuit.

2. Description of the Related Art

Parasitic capacitances associated with the conductive elements of densely packed circuits, such as very large scale integrated circuits (VLSIs), can result in unacceptable circuit performance. For example, they can significantly slow down the circuit operation, and particularly for analog circuits can produce cross-talk between conductors. It is very desirable to calculate parasitic capacitances from the circuit layout to determine whether they exceed the design criteria. If calculated capacitances are excessive, the design can be corrected before committing to the time consuming and costly circuit fabrication process.

A calculation technique has been established to determine capacitances between conductors located in three dimensions. The technique is described in Ruehli and Brennan, "Efficient Capacitance Calculations for 3-Dimensional Multi-Conductor Systems", *IEEE Transactions on Microwave Theory and Techniques*, Vol. MTT-21, No. 2, February 1973, pages 76–82 and in van der Meijs and van Genderen, "An Efficient Finite Element Method for Submicron IC Capacitance Extraction", 26th *ACM/IEEE Design Automation Conference*, Paper 40.2, 1989, pages 678–681. It involves a determination of a potential coefficient (the quantity that yields the voltage across capacitor plates when multiplied by the charge on the plates) matrix between the various conductors in the analysis. The potential coefficient matrix is inverted to obtain a short circuit capacitance matrix, from which an equivalent circuit capacitance matrix is derived that is normally used in a circuit simulation.

Two types of software approaches to parasitic capacitance calculation and extraction have been developed. The first type allows for the automatic calculation of parasitic capacitances based upon a geometrical description of a chip contained in a layout data base. This approach considers only interactions between two conductors at a time, ignoring the important effects of other nearby conductors. While a large circuit with many conductors can be analyzed, the failure to model the actual fringing electrical fields between conductors, or to account for multi-electrode interactions among all of the conductors, seriously degrades the accuracy of the results. Some parasitic capacitances are not detected at all, while others are overestimated by well over 100%. This approach is used in the PDextract system provided by CADENCE Design Systems of San Jose, Calif., as described in its *Physical Design Verification Reference Manual*, Version 2-1, Jun. 5, 1989, pages 5-32 through 5-48.

The other type of software, designated as the CASSE Parasitic Parameters program, is described in Pacific Numerix Corporation, *Parasitic Parameters User's Manual*, as revised Aug. 10, 1989. It uses the Ruehli and Brennan approach to consider the interactions among all parts of the entire circuit, and extends it to non-Manhattan-oriented geometries with a numerical integration technique for oblique lines. This gives accurate results, but the maximum circuit size that can be analyzed is severely limited because the computer memory requirements increase roughly in proportion to the square of the chip area. This type of software is not designed for automated extraction from a CAD (computer aided design) layout data base, but rather requires extensive manual input. Since the efficiency of the program is maximized when as many of the conductors as possible are "Manhattan-oriented" rectangles (rectangles arranged in a grid matrix), conductors with non-Manhattan rectangle geometries are handled by calculating a division of such conductors into many small rectangular pieces. This "fracturing" technique often produces a very large number of small rectangles, which further limits the ability of the program to handle larger circuits. A system that is similar to the CASSE Parasitic Parameters program, and also requires a great amount of computational time for larger circuits, is disclosed in Janak and Ling, "C3DSTAR: A 3D Wiring Capacitance Calculator", *IEEE ICCAD-89 Digest*, November 1989, pages 530–533.

SUMMARY OF THE INVENTION

The present invention seeks to provide an improved method of calculating the parasitic capacitances associated with a complex circuit that is accurate, takes into account multi-conductor effects, and can handle VLSI circuits in an efficient manner without an excessive amount of calculation time.

In accordance with the invention a physical layout of a circuit is divided into a plurality of windows, each of which includes a substantially smaller number of conductors than are included within the overall circuit. The parasitic capacitances associated with the conductors of each window are calculated, and the results for each window are then combined to obtain a parasitic capacitance matrix for the overall circuit. Adjacent windows preferably overlap each other, with the capacitance values determined for a pair of conductors that lie in more than one window averaged to a single value. To limit the size of the windows and yet preserve a high degree of accuracy, the window dimensions are preferably on the order of the distance of substantial parasitic capacitances between the circuit conductors.

A coarse fracturing technique is employed that divides non-Manhattan-oriented rectangular and non-triangular conductive polygons into a small number of Manhattan-oriented rectangular and triangular shapes, thereby providing an ability to handle complex shapes without unduly increasing the amount of required computations. The fracturing technique involves the extension of a ray through the polygon from one of its vertices to intersect an opposed segment of the polygon, and then defining the peripheries of simpler geometric elements as comprising the ray and respective different portions of the polygon's periphery. Multiple rays may be extended from each of the polygon's vertices in succession until a ray that begins from inside the polygon is located, as indicated by the ray intersecting an odd number of polygon segments. The fracturing process can begin as soon as such a ray is located, or alternately fracturing can be based upon each of multiple rays from the same vertex that begin within the polygon. Once the initial fracturing is completed, any resulting elements that are still non-Manhattan-oriented rectangular and non-triangular are further fractured until the desired simplified shapes are obtained.

A special fracturing technique is used for the case of two conductors in generally parallel but closely spaced planes, when the edge of the first conductor overlaps the interior of the second. The second conductor is fractured into geometric elements of which at least some have a common edge that lies along a projection of the first conductor's edge, with none of the interiors of the geometric elements thus formed traversed by the projected edge. The parasitic capacitance associated with the first conductor and the geometric elements of the second conductor are then calculated with much reduced inaccuracies due to edge effects. If the projected edge extends only partially through the interior of the second conductor, it is preferably extended to the periphery of the second conductor when forming the geometric elements.

These and other features and advantages of the invention will be apparent to those skilled in the art from the following detailed description, taken together with the accompanying drawings.

DETAILED DESCRIPTION OF THE INVENTION

Figure 1:
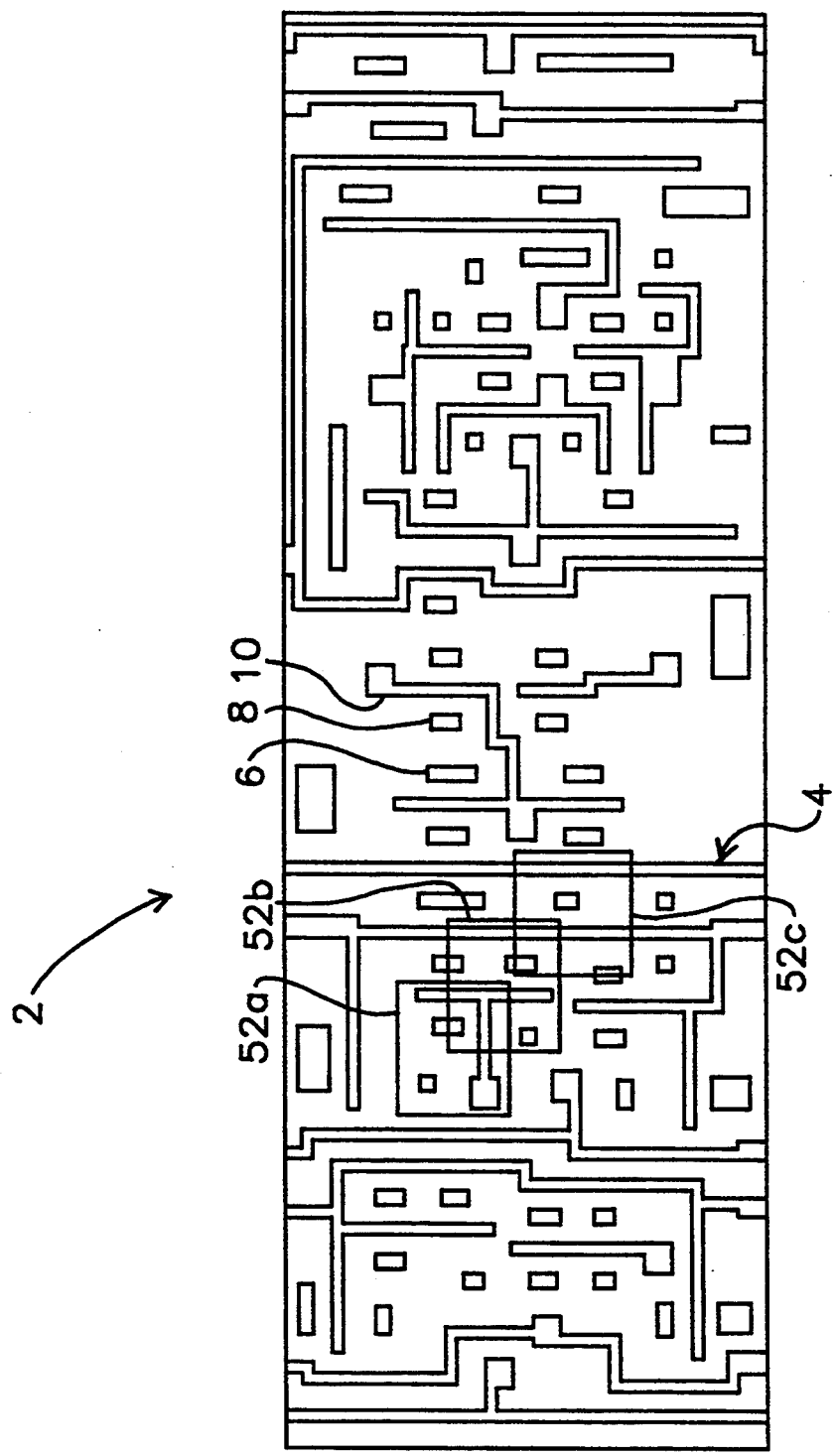
FIG. 1 is a plane view of an IC chip showing a typical conductor layout, together with windows used to divide the chip into more manageable areas in accordance with the invention.

One plane of a conductor layout for an IC chip 2 to which the invention is applicable is shown in FIG. 1. Only conductive areas 4 are shown, although the chip will include many other devices such as transistors, resistors, etc. Also, the chip will typically include multiple parallel conductor planes that are mutually spaced from each other, and the invention is also applicable to the determination of parasitic capacitances between conductors on separate planes.

Each of the separate conductive areas may be considered as polygons that, if they do not already have the desired shape, are to be divided into preferably Manhattan-oriented rectangles or at least triangles for purposes of parasitic capacitance analysis. For example, conductive polygons 6 and 8 already exhibit Manhattan-oriented rectangular geometries, and require no division. By contrast, polygon 10 has a complex shape that is divided into Manhattan-oriented rectangles before the parasitic capacitance calculation is performed. In accordance with the invention, the complex polygon 10 is coarsely divided into a minimum or near minimum number of rectangles, thus reducing the number of separate elements involved in the capacitance calculation, and thereby substantially simplifying and increasing the speed of that calculation. The invention's preferred polygon fracturing techniques are described hereinafter.

The geometric descriptions of the various conductors are preferably provided from a database from which automatic calculations may be made. The invention determines the values of all of the equivalent-circuit parasitic capacitances among the set of conductors on the chip, given the geometrical dimensions of the conductors and of the surrounding dielectric media. The PDextract system mentioned previously contains a layout data base and a language (SKILL) for accessing that database so that the geometrical information required by the invention can readily be accessed. In the preferred embodiment, the multiconductor parasitic capacitance calculation program of the present invention can be called by the CADENCE PDextract system and appears to be running within that system.

Figure 2:
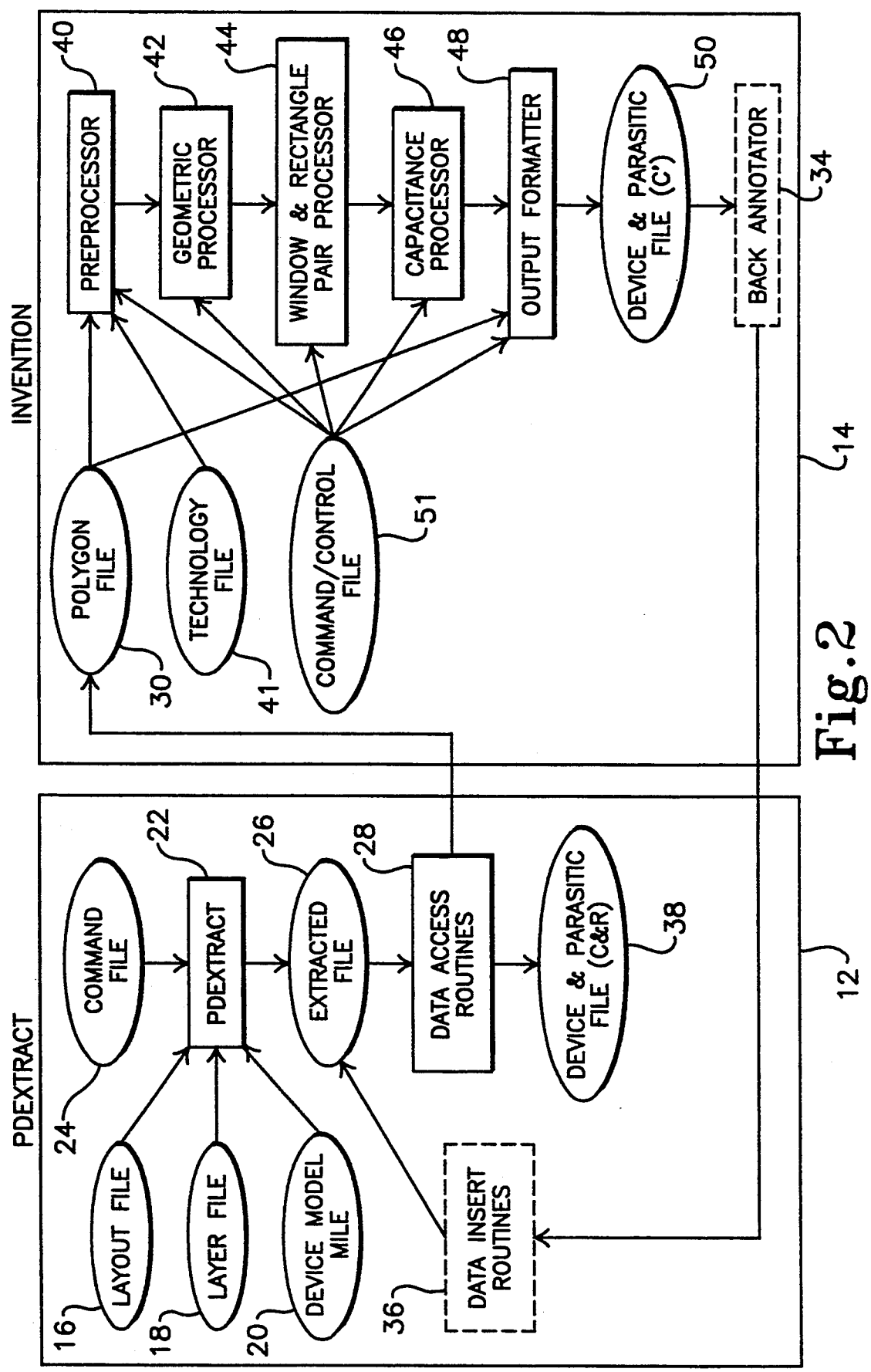
FIG. 2 is a block diagram illustrating the integration of the invention into a prior circuit data base.

The interrelationship between the PDextract environment and the invention is shown in FIG. 2, with PDextract routines enclosed within the left box 12 and routines employed by the invention enclosed within the right box 14. A layout file 16, layer file 18 and device model file 20 provide information to the PDextract routine 22 that, under the control of a command file 24, generates geometric descriptors of the circuit and layout. This information is transferred to an extracted file 26, from which the relevant descriptors are accessed by a data access routine 28 and delivered to a polygon file 30 that includes both geometrical data describing the circuit and circuit interconnection data in the invention portion of the system. The parasitic capacitance values determined by the invention are supplied by a back annotator 34 in the invention block to data insert routines 36 in the PDextract block (both shown in dashed lines) to substitute the invention's more accurate capacitance values for the less accurate capacitance values in a device and parasitic file (C&R) 38 that is included within the PDextract block. These more accurate capacitance values then become part of the input file for subsequent circuit simulation. The resistance values (R) determined by the PDextract program are not modified by the invention.

Within the invention block, a preprocessor routine 40 establishes the characteristics of the layers of surrounding dielectric media and the positions of conductors within these layers from the information in the polygon file 30, and in a technology file 41 that stores information on the dielectric material and on vertical positions (levels) of the various planes of conductors. A geometric processor routine 42 performs a fracturing process, dividing each conductor with a complex geometry into simpler polygons of which as many as possible are Manhattan-oriented rectangles and the remainder are triangles. A window and rectangle pair processor 44 then determines the pairs of polygons that are close enough to each other for significant electrical interaction, and the potential coefficients associated with these interactions. As discussed below, this routine uses a windowing technique that significantly reduces the number of calculations that must be performed. The maximum interaction distance can be determined empirically by the user and input into the window and rectangle pair processor 44 to establish the sizes of the windows, as discussed below.

Once a matrix of potential coefficients has been generated for the polygons within each window, a capacitance processor 46 calculates accurate parasitic capacitance values for each window using the potential coefficients and the method of partial capacitances described in the literature, such as the 1973 Ruehli and Brennan article referenced above. After taking into account the effects of overlaps between adjacent windows by averaging the capacitance values for polygons located in two overlapping windows, an output formatter 48 produces a readable report file 50 within the invention block. The report file 50 provides accurate parasitic capacitances for use in subsequent circuit simulations, and/or supplies the results for automatic back annotation to the device and parasitic file (C&R) 38 of the PDextract block. The latter file when so supplied contains both parasitic values as computed in accordance with the invention, and parasitic resistance values computed by the PDextract program. A command/control file 51 can be created manually by the user with various command/control parameters for selecting among options in the execution of the program; this file supplies command/control signals to one or more of the preprocessor 40, geometric process 42, window and rectangle pair processor 44, capacitance process 46 and output formatter 48.

Referring back to FIG. 1, a "windowing" technique is illustrated that can be used to greatly simplify and speed up the parasitic capacitance calculations for a complex circuit. Once the conductive areas of the circuit have been broken down into simpler Manhattan-oriented rectangles and triangular elements, a typical circuit may contain on the order of 10,000 such elements. While it would be necessary to set up and invert a 10,000×10,000 potential coefficient matrix to take each separate pair of elements into account in calculating the parasitic capacitance matrix, this would require an excessive amount of computer time. In accordance with the invention, the circuit is divided into separate portions or "windows", a parasitic capacitance matrix is established for the elements within each window, and the various windows are then compiled together to obtain a full parasitic capacitance matrix for the overall circuit. This approach requires much less computer time than does a single matrix that considers all of the circuit's elements at once. For example, if a 10,000 element circuit is divided into 100 discrete windows (or 200 overlapping windows), the computation time required for 100 (or 200) 100×100 matrices is much less than for a single 10,000×10,000 matrix.

The division of circuit 2 into computational windows is illustrated by three overlapping windows 52a, 52b and 52c. The entire circuit would be divided among 60 such windows, although only three are illustrated. Overlapping the windows allows significant parasitic capacitances between an element within a given window and a near element just outside that window to be taken into account. If a pair of elements is included within an overlap area, such that a parasitic capacitance for the pair is calculated for both of the overlapping windows, the Calculated capacitances can simply be averaged when the capacitance matrices for the various windows are compiled.

The windows can be organized into a grid, as illustrated in FIG. 1, or in other ways such as along a critical node that runs throughout the chip. The window size can be selected so that either an optimum number of conductive elements, say 15–25, are included within each window, or more preferably so that the window dimension corresponds to the maximum interaction distance across which separate elements on the chip will exhibit a significant potential coefficient. The selection of a maximum interaction distance is somewhat arbitrary, but the purpose is to exclude parasitic capacitance calculations for pairs of elements that are spaced so far apart that the parasitic capacitance between them is de minimus. The maximum interaction distance for a given chip can be determined empirically by modeling the chip's conductive circuitry, and is dependent upon the particular chip materials used. Once the maximum interaction distance has been selected for one chip, the same distance may be used for other chips within the same family.

All parasitic capacitance interactions are considered within each of the dynamically selected, overlapping windows; the entire circuit is covered by advancing the window to successive locations. This provides accurate results within each window, with an averaging technique used to preserve the accuracy where adjacent windows overlap. Since computer memory requirements increase roughly in proportion to the square of the window area, the maximum circuit size that can be accommodated in a practical system is not severely limited.

Figure 3:
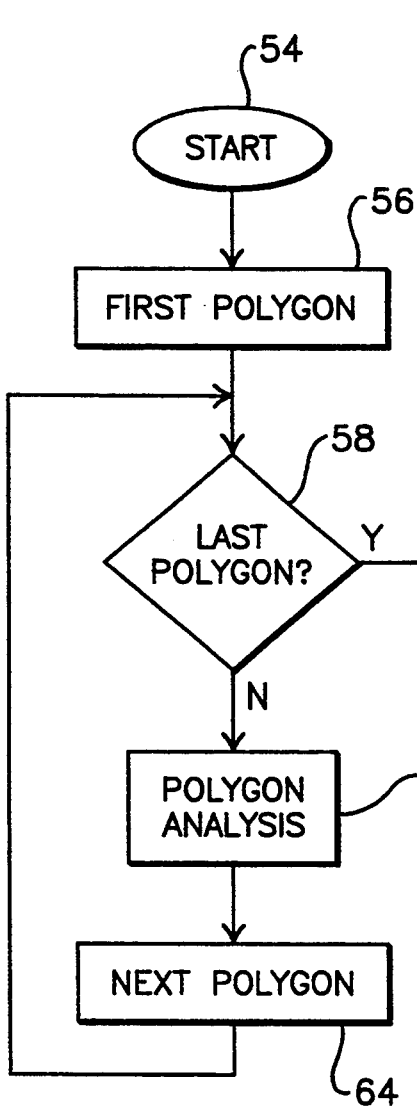

The manner in which conductors with complex polygon shapes are divided into Manhattan-oriented rectangles or triangles will now be described. FIG. 3 is a simplified flow diagram that illustrates the cycling of the various conductive polygon shapes within a given window. A start command 54 calls up the first polygon 56 within the window. It should be recalled at this point that geometric descriptors of each conductive polygon are provided from a suitable data base, such as the PDextract system mentioned previously. A determination 58 is made as to whether the previously called polygon was the last polygon in the window. If it was, the sequence goes to stop 60. If it was not, the called polygon is subjected to a polygon analysis routine 62 that determines whether it should be fractured into simpler geometric shapes, and performs the fracturing if called for. The next polygon 64 is then called, and the cycle loops back to decision block 58 which determines whether the polygon previously called was the last one in the window.

Figure 4:
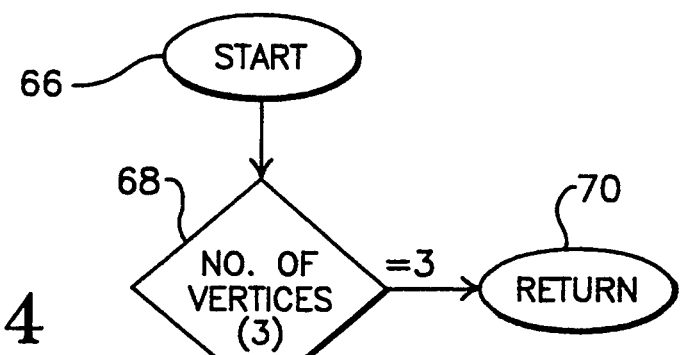
FIGS. 3-5 are flow diagrams respectively of polygon cycle, polygon analysis and vertex analysis routines used in the preferred embodiment of the invention.

FIG. 4 is a flow diagram for the polygon analysis routine that is used to determine whether a given polygon needs to be divided into elements with simpler shapes. Upon start 66 the geometric descriptors for the polygon being analyzed are reviewed in decision block 68 to determine the number of vertices included within the polygon, relative to three. If the polygon has only three vertices, an acceptable triangle shape is indicated and the program enters a return 70 to the polygon cycling routine of FIG. 3. If it has more than three vertices, a decision block 72 determines whether the number of vertices are equal to or greater than four. If the number is greater than four, a complex polygon shape is indicated and the program enters vertex analysis and fracture routines 74 that divide the polygon into simpler Manhattan-oriented rectangles or triangles, followed by a return 76 to the polygon cycling routine of FIG. 3. If the number of vertices is equal to four, a decision block 78 determines whether the polygon is a Manhattan-oriented rectangle. For most circuits all rectangular conductors can be assumed to be Manhattan-oriented, but it is possible to encounter a non-Manhattan-oriented rectangle; this is considered to be a complex polygon that must be further fractured (into two triangles). If it is a Manhattan-oriented rectangle, a return 80 to the polygon cycling routine is entered; if it is not the vertex analysis and fracture routines 74 are entered. In this manner each polygon within the window is in turn analyzed and either accepted in its original shape, or divided into simpler shapes if it is complex.

Figure 5:
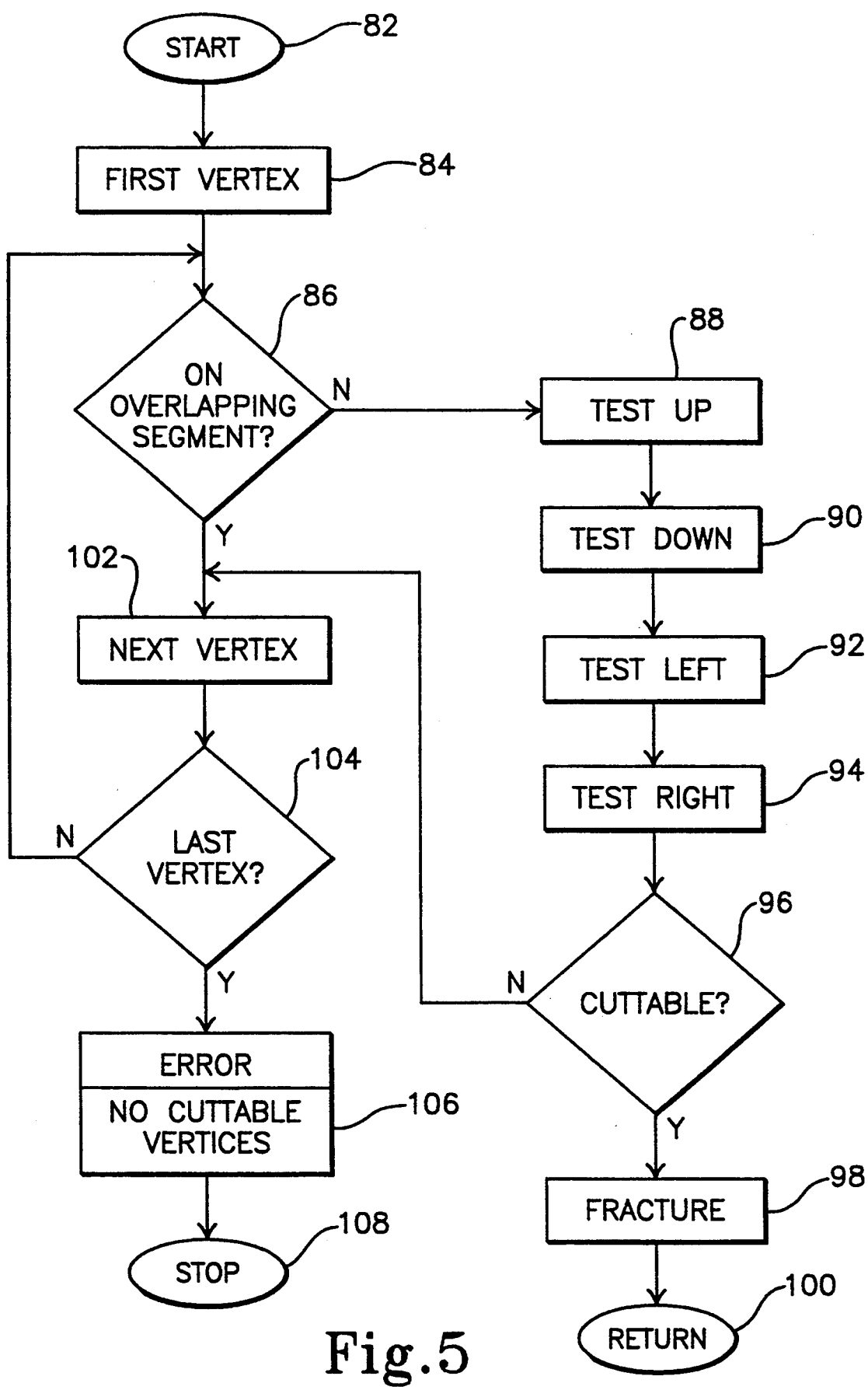

A preferred polygon vertex analysis routine is illustrated in FIG. 5. At the start 82 of this routine, the first vertex 84 of the polygon to be simplified is called from the data base. A decision block 86 determines whether the called vertex is on an overlapping segment (overlapping segments are discussed below in connection with FIG. 9). If it is not on an overlapping segment, a test routine is entered to determine whether the polygon can be divided into simpler elements from that particular vertex. The test consists of extending rays from the vertex, preferably in an x,y coordinate pattern, and determining whether any of the rays immediately enter the interior of the polygon, as indicated by their intersecting an odd number of polygon segments. The sequence in which the rays is extended from the vertex is illustrated as first being a test up 88, then a test down 90, followed by a test left 92 and a test right 94, although the particular sequence is arbitrary. A decision block 96 determines whether any of the test rays satisfy the condition for fracturing or cutting the polygon into simpler elements. If the condition is satisfied, the program enters a polygon fracture routine 98, followed by a return 100 to the polygon analysis routine of FIG. 4.

If the polygon is found by decision block 96 to not be cuttable from the vertex being analyzed (or if the vertex was on an overlapping segment), the program calls the polygon's next vertex 102. Decision block 104 then determines whether the previous vertex being analyzed was the last vertex in the polygon. If it was the last vertex an error routine 106 is entered, since the polygon was determined to be subject to fracturing by the polygon analysis routine of FIG. 4 but no vertices were located from which the fracture could be made. The program accordingly goes to stop 108 so that an error analysis can be made. On the other hand, if decision block 104 determines that the previous vertex to be analyzed was not the last vertex of the polygon, the program returns to decision block 86 to initiate an analysis of the vertex that has just been called.

Figure 6:
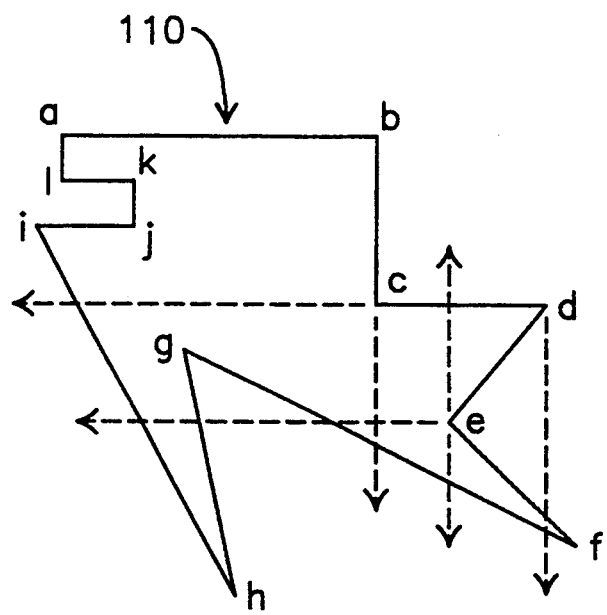
FIG. 6 is a diagram showing the application of the vertex analysis routine to a complex polygon.

An application of the FIG. 5 vertex analysis routine to a complex polygon 110 is illustrated in FIG. 6. Polygon 110 is shown as having 12 vertices, labeled a-1. Starting from vertex a, no rays drawn up, down, left or right from the vertex would immediately enter the interior of the polygon, so this vertex is not one from which a division of the polygon is made; the same is true for vertex b. From vertex c, rays extended down and to the left each immediately enter the interior of the polygon, as indicated by their intersecting only one segment of the polygon. Accordingly, the polygon may be divided from vertex c along either one or both of the rays. Currently available algorithms may be employed to determine the intersections of the rays with the polygon segments and whether the rays immediately enter the interior of the polygon; see, for example, Sedgewick, *Algorithms*, Addison-Wesley Publishing Co., 1983, pages 312-316.

Now considering vertex d, it can be seen that a downward extended ray intersects two segments of the polygon; this even number of intersections indicates that the ray does not begin inside the polygon. Moving on to vertex e, rays extended upward, downward and to the left all intersect an odd number of polygon segments, and are therefore interior rays; one or more of these rays can be used to fracture the polygon into simpler shapes. Note that the ray extended to the left from vertex e first travels through the interior of the polygon, then outside of it, and then again through its interior. If this ray is used as a fracture line, the fracture would normally be between the vertex and its first intersection with a polygon segment.

The selection of the particular vertex to start with for the vertex analysis of FIG. 5 is arbitrary. Once a vertex from which a polygon fracture can be made is located, the fracture can be done either from a single ray extended from that vertex, or from multiple rays (if available) extended from the same vertex. Examples of each technique are provided below in connection with FIGS. 8a, 8b and 9.

Figure 7:
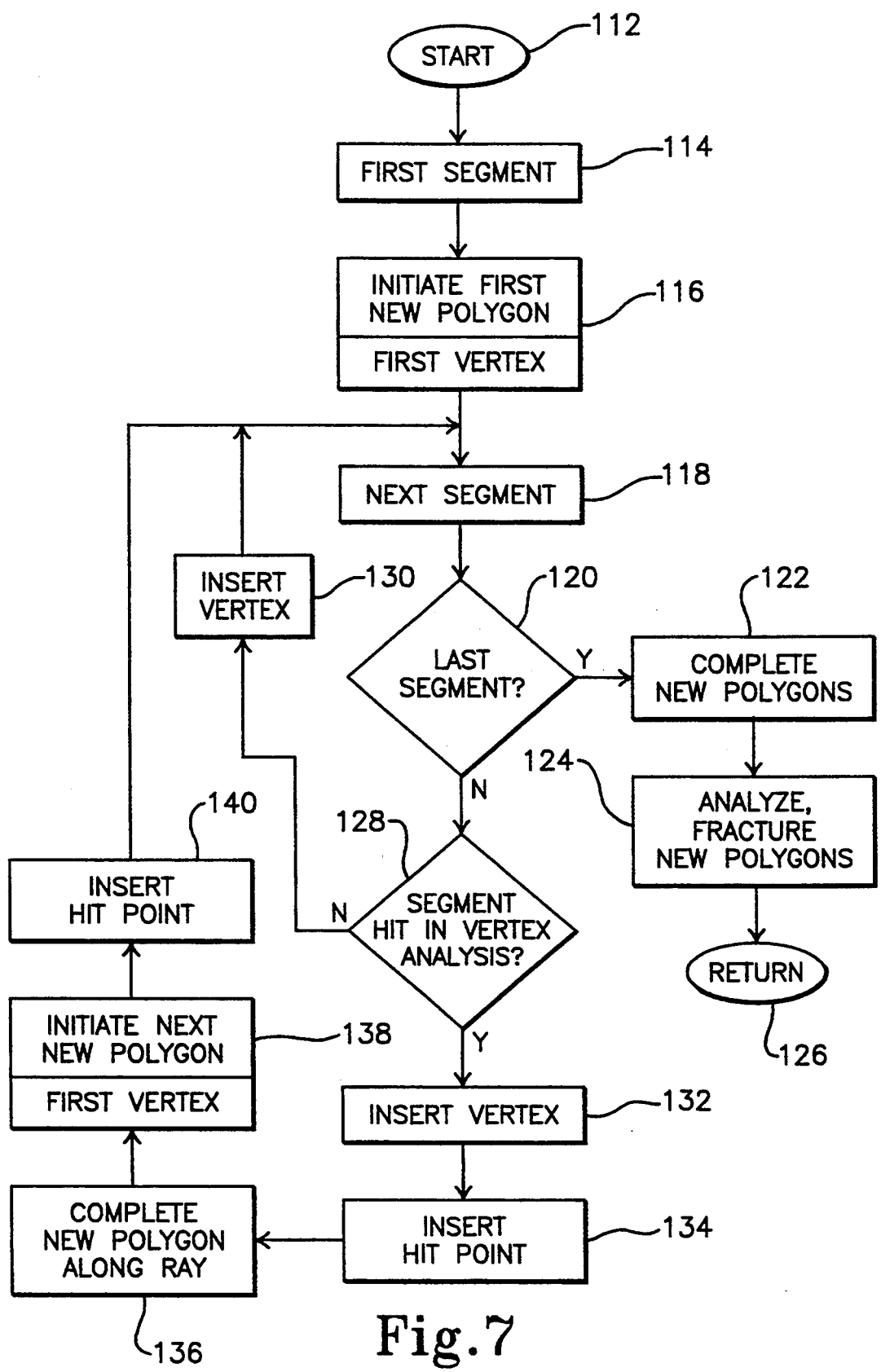
FIG. 7 is a flow diagram of a polygon fracture routine.

FIG. 7 is a flow diagram of a polygon fracture routine by which a complex polygon is divided into simpler elements. Start 112 for the routine is entered at the beginning of the fracture routine 98 of FIG. 5. A call up 114 of the first segment in the periphery of the original polygon, beginning from the vertex from which the polygon fracture is being performed, is first made. This initiates the establishment of the first new or fractured polygon 116, with the vertex at the end of the first segment taken as the first vertex of the new polygon (after the vertex from which the fracture is being performed). The next segment 118 of the original polygon is then called up. A decision 120 is made as to whether the segment just called up is the last segment of the original polygon. If it is, a routine 122 is entered to complete the new polygon along this last segment, followed by a routine 124 in which the new polygons formed from the original polygon are themselves analyzed to determine if they are Manhattan-oriented rectangles or triangles, and fractured into still simpler shapes if they are not. After the original polygon has been fractured, and subfractured if necessary, into the desired Manhattan-oriented rectangles or triangles, a return 126 is made to the next polygon in the polygon cycle routine of FIG. 3.

Assuming that the segment just called up and added to the new polygon is not the last segment of the original polygon, a decision block 128 is entered that determines whether the segment just called up was "hit" (intersected by a ray extended from the source vertex) during the vertex analysis routine. If it was not hit, the vertex at the end of the segment is inserted as a vertex of the new polygon being formed (subroutine 130), and the program loops back to call the next segment (118) of the original polygon.

If, on the other hand, the segment was hit during the vertex analysis, an insert vertex routine 132 for the new polygon is entered, but the hit point is inserted as the vertex in subroutine 134, rather than the end of the hit segment. The new polygon is then completed by travelling from the hit point back along the ray to the original vertex from which the ray was extended (subroutine 136). The next new polygon is then initiated in subroutine 138, with the first vertex of the next new polygon again taken as the vertex from which the ray originated. The first segment of the second new polygon is taken along the ray by inserting the hit point 140 as the vertex at the end of the second new polygon's first segment. The program then loops back to a callup of the next original polygon segment 118, which serves as the next segment of the second new polygon. The fracturing process continues in this manner until the original polygon has been fractured into simpler polygons and the simpler polygons are themselves fractured, if necessary, to yield elements that are either Manhattan-oriented rectangles or triangles.

Figure 8A:
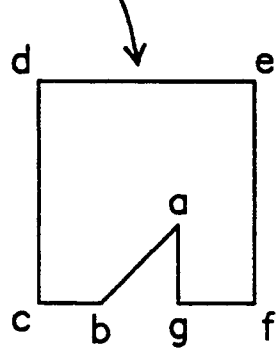
FIGS. 8a and 8b are diagrams of a complex polygon before and after the application of the fracture routine of FIG. 7, respectively.
Figure 8B:
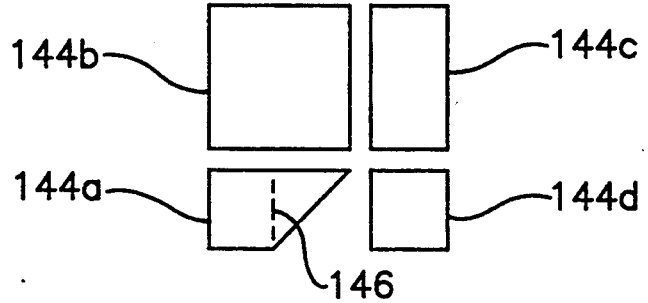

An application of the FIG. 7 fracturing routine to an illustrative polygon 142 is given in FIGS. 8a and 8b. Polygon 142 is illustrated as having seven vertices a–g, of which only vertices a and b are "cuttable". In general, fracturing is performed from the first cuttable vertex to be located; further fracturing is performed upon the new polygons formed from the first cuttable vertex, rather than proceeding to other cuttable vertices in the original polygon.

FIG. 8b shows the complex polygon 142 divided into four new and simpler polygons 144a, 144b, 144c and 144d, based upon rays extended to the left, upward and to the right from vertex a. The outer new polygons 144a and 144d are bounded by the segments of the original polygon that extend between vertex a and the hit points of their respective rays, and by said rays. The inner new polygons 144b and 144c are bounded by respective pairs of rays extended from vertex a and by the peripheral segments of the original complex polygon between those rays.

New polygons 144b, 144c and 144d each have Manhattan-oriented rectangular geometries, and are therefore suitable for use as individual elements in the calculation of parasitic capacitances; capacitances would be determined between each of these elements and each of the other geometric elements from the other conductors included within the same window. New polygon 144a, however, requires further fracturing, and this would be performed along ray 146 to divide it into a Manhattan-oriented rectangle and a triangle.

Figure 9:
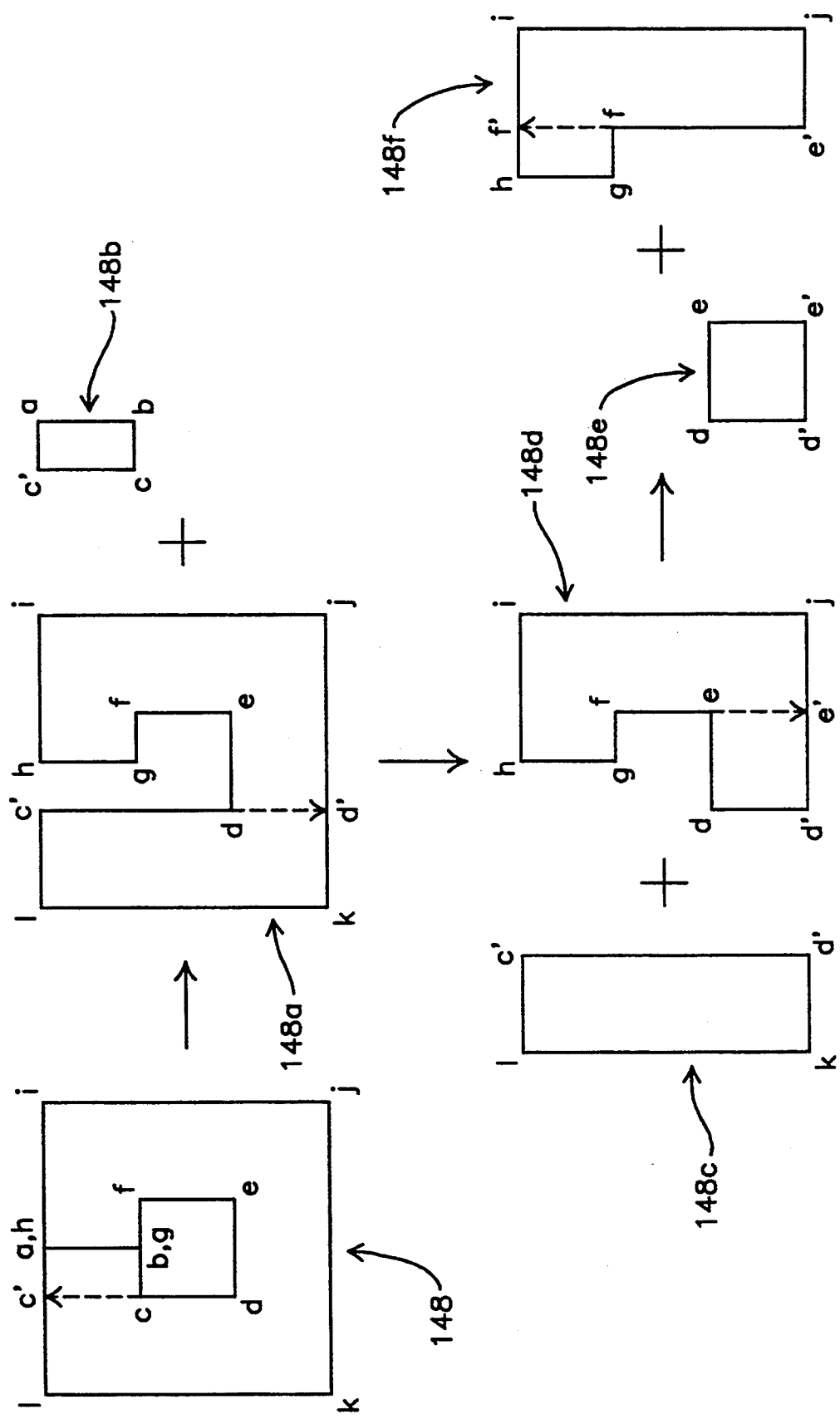
FIG. 9 is a diagram of a complex polygon during successive steps of an alternate fracture routine.

FIGS. 8a and 8b illustrate a fracturing technique in which the original polygon is fractured along all of the acceptable rays that extend from a given vertex. An alternate technique, in which fracturing is performed only along a single ray from a given vertex, is illustrated in FIG. 9. A complex polygon 148 is shown which has an outer rectangular shape, but with an interior cutout. In defining such a geometry the PDextract system starts from a point a on the outer periphery of the polygon, extends an imaginary segment to a point b on the periphery of the inner cutout, and then progresses around the vertices c, d, e, f of the inner cutout back to point b; the point of return is designated as a separate point g. From this point a second imaginary segment is established to point h, which coincides with point a on the polygon's outer periphery. The imaginary segments ab and gh coincide with each other, and are referred to herein as overlapping segments. From point h the definition of the polygon continues around its outer periphery through vertices i, j, k and l, and then back to the origin at point a.

In determining a "cuttable" vertex from which the polygon may be fractured, points a and b are excluded because they lie along an overlapping segment. Vertex c is then tested, and an upward extending ray that intersects segment al at point c' is found that provides a suitable fracture line. At this point, instead of testing in other directions from vertex c as with the illustration of FIGS. 8a and 8b, further testing is avoided once the first cuttable ray is identified and the polygon 148 is fractured into subpolygons 148a and 148b along the c–c' ray and the overlapping segment ab. The resulting subpolygon 148b is a Manhattan-type rectangle that is suitable for use as an element in establishing the parasitic capacitance matrix, whereas subpolygon 148a is complex and requires further fracturing. Beginning from vertex d, the first suitable ray for fracturing extends down to intersect segment jk at point d'. Fracturing along this ray yields two new subpolygons: a Manhattan-oriented rectangle 148c and a complex polygon 148d. A fracture line for subpolygon 148d is established by a downward ray from vertex e to point e' on segment d'j. The result of this fracture is another Manhattan-oriented rectangle 148e and another complex subpolygon 148f. The latter subpolygon can then be fractured along an upward extending ray from vertex f to point f' on segment hi to produce two final elements that are both Manhattan-oriented rectangles.

Fracturing and subfracturing of all the complex polygons within a given window continues until no elements are left except for Manhattan-oriented rectangles and triangles. The described algorithms result in a coarse fracturing, with a minimal or near minimal number of elements resulting from each complex polygon. This limitation on the number of separate elements employed in establishing the potential coefficient and resulting parasitic capacitance matrixes minimizes or comes close to minimizing the required computational time for the conductive polygons in a particular window, while generating a high accuracy in most situations.

One source of inaccuracy is the neglect of an accumulation of charge that develops at conductor edges when the edge of a conductive polygon in one plane overlaps the interior of a conductive element in a generally parallel but spaced plane. Typical circuit configurations have multiple layers of conductors. The edge of a conductor on one layer might lie above or below the interior of a conductor on another layer. In this situation, the fracturing technique as described thus far can lead to serious inaccuracies in the computation of parasitic capacitances. The severity of this inaccuracy increases as the vertical separation decreases between polygons that are on different planes and also on different electrical nodes. Accordingly, the size of this vertical separation can be used as the basis for a decision as to the necessity of the refinement that will now be described. To restore the accuracy provided by the invention, a second polygon that is overlapped by the edge of the first polygon is fractured into subpolygons that eliminate the overlap. The overlapping edge of the first polygon is projected onto the second polygon, which is fractured so that at least some of its fractured elements have a common edge that lies along the projection. Furthermore, the fractured elements are established so that none of their interiors are traversed by the first polygon's projected edge.

Figure 10:
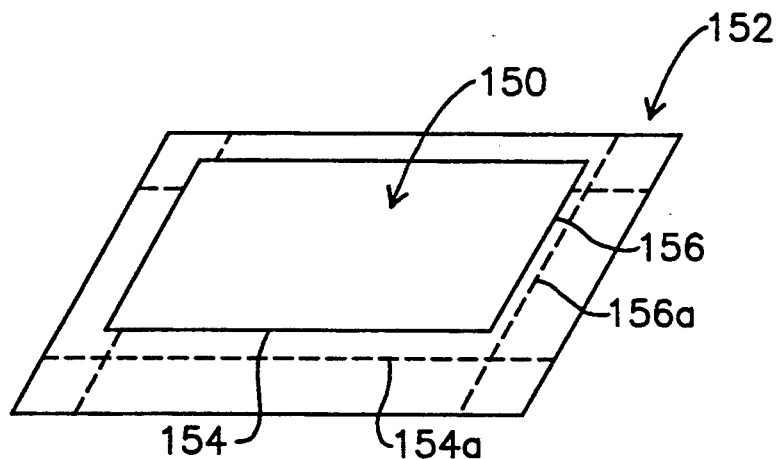
FIG. 10 is a perspective view illustrating a special fracture technique used in the case of overlapping conductors in two planes.

This refinement of the fracturing technique is illustrated in FIG. 10. An upper rectangular element 150 is shown over a large rectangular element 152, with each of the edges of element 150 spaced inward from the edges of element 152. Thus, each of rectangle 150's edges will project down onto the interior of element 152; edge 154 is shown projected as dash line 154a, while edge 156 is shown projected as dash line 156a. Where the projected edge of element 150 extends only partially across the interior of element 152, the projection lines are preferably extended to the periphery of element 152. As a result, element 152 is divided into nine separate rectangular elements, as indicated by the dashed line grid.

Figure 11A:
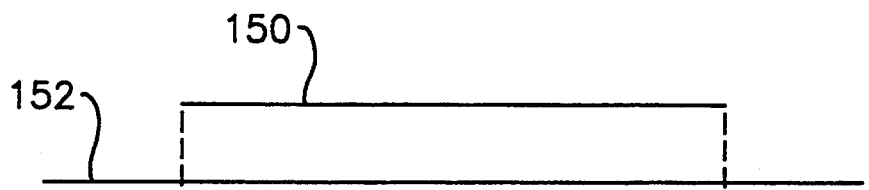
FIGS. 11a–11d are graphs respectively showing the relative positions of the upper and lower conductive plates of FIG. 10, the actual charge distribution on the lower plate, the calculated charge distribution with an equal fracturing of the lower plate, and the calculated charge distribution with a fracturing of the lower plate in accordance with the invention.

The reason for the desirability of this novel fracturing along a projection of an overlapping element can be explained in connection with FIGS. 11a-11d. FIG. 11a is an end view of the two rectangular elements 150 and 152. At this point is should be recalled that the preferred parasitic capacitance calculation technique for the present invention requires that the potential coefficients between different conductive elements first be calculated, and that the matrix of these values be inverted to obtain capacitance values. This matrix approaches a singular condition for very close parallel plates, somewhat akin to dividing by a number close to zero, so that highly accurate estimates of the individual potential coefficients between different elements are required to obtain accurate parasitic capacitance values. Furthermore, the estimate of the potential coefficient between the upper element 150 and a ground reference is in error by nearly a factor of 2 when each element is taken as a single rectangular piece. For this reason, the single rectangular element representation for elements 150 and 152 breaks down for the case of large, nonidentical and closely spaced elements even though it works quite well for most other situations.

Figure 11B:
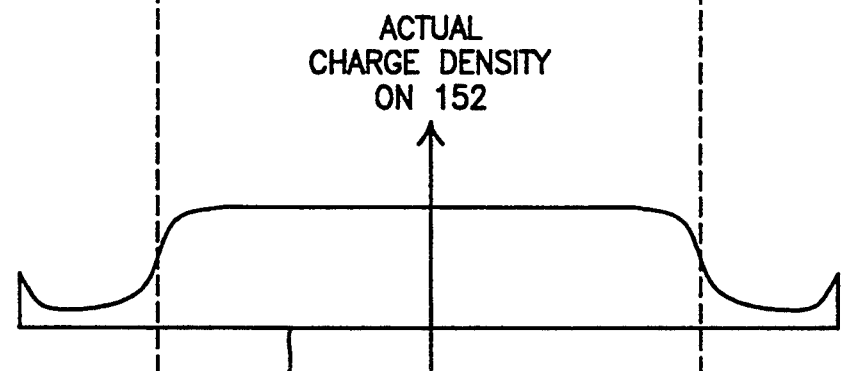
Figure 11C:
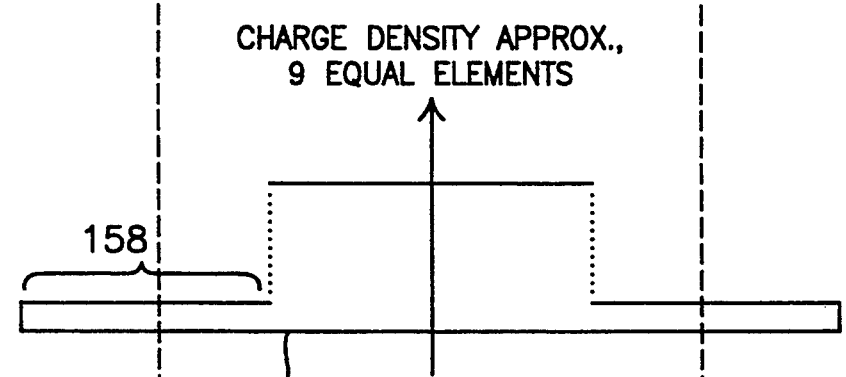

The prior method for calculating capacitances assumes a uniform surface charge density over each element, although the charge density can be different from one element to another. FIG. 11b illustrates the actual charge distribution on lower element 152 with different voltages on the two elements 150 and 152. The charge distribution is nearly uniform except in the region directly below the edges of the upper element 150. FIG. 11c shows the approximation of FIG. 11b that results from fracturing the lower plate 152 into nine identical segments, each with an equal width 158 and an equal length. The result is a poor approximation to the true charge density shown in FIG. 11b.

Figure 11D:
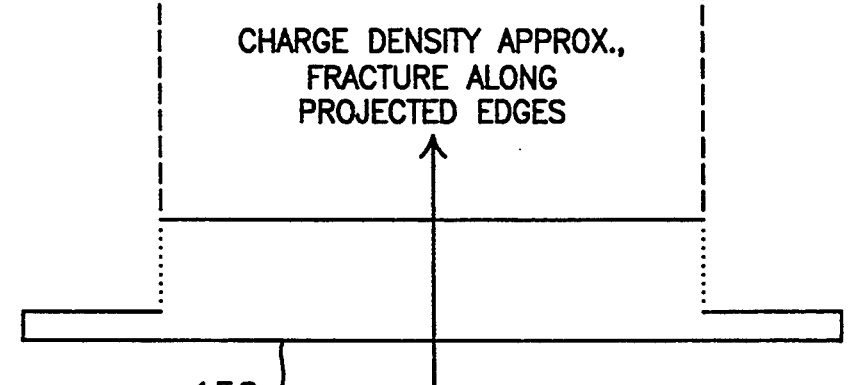

The result of fracturing element 152 along boundaries that correspond to the projections of the overlapping edges of upper element 150 is given in FIG. 11d. It can be seen that this improved fracturing technique results in a good staircase approximation to the true charge distribution by placing the boundaries of the fractured elements, and therefore the charge discontinuities, at the locations where the true charge distribution is most rapidly varying.

The improved fracturing technique for use with overlapping elements may increase the ultimate number of elements used in the calculation of parasitic capacitances, and thus increase the required computational time somewhat. However, the increase in computations will generally not be significant compared to the reduction in computational requirements achieved with the present windowing technique, and in any event the increased computations for a given pair of overlapping elements will be restricted to the window in which they appear.

Where there are more than two layers of conductive elements in a given window, parasitic capacitances would generally be calculated between an element in one layer and all of the other elements in the other layers. It may not be necessary to generate a fracturing of an element on one plane along a line that lies below an edge of a conductor on a higher plane if there is an intervening conductor on an intervening plane, provided that the intervening conductor does not have an edge immediately below the edge of the conductor on the higher plane.

The present method of calculating parasitic capacitances is thus quite accurate, and yet has a much lower computational requirement for large scale circuits and prior techniques of comparable accuracy. While particular embodiments for implementing the invention have been shown and described, numerous variations and alternate embodiments will occur to those skilled in the art. Accordingly, it is intended that the invention be limited only in terms of the appended claims.

We claim:

1. A method of designing and fabricating an electrical circuit, comprising the steps of:
   producing a tentative electrical circuit design having a physical layout,
   computing parasitic capacitances between multiple electrical conductors within said electrical circuit design by:
      computing a division of the physical layout of said electrical circuit design into a plurality of windows in which at least one of said windows overlays at least one other of said windows, with at least some of said windows including respective pluralities of electrical conductors and at least one of said overlaps including at least one pair of electrical conductors,
      for each window, determining the parasitic capacitance values associated with the electrical conductors of that window by the method of partial capacitances, and
      combining the parasitic capacitance values of said windows, and averaging the parasitic capacitance values of electrical conductor pairs included in a window overlap between the windows forming said overlap, to obtain a set of parasitic capacitances for said electrical circuit,
   adjusting said tentative circuit design to correct for any excessive computed parasitic capacitances, and
   fabricating electrical circuits in accordance with said adjusted circuit design.

2. The method of claim 1, wherein said windows have physical dimensions that are on the order of the distance parasitic capacitances between the conductors of said over which electrical conductors within said electrical circuit have a parasitic capacitance between them that is more than de minimis.

3. The method of claim 2, wherein at east some of said electrical conductors have shapes that are non-rectangular and non-triangular multi-vertex polygons, a division of each said multi-vertex polygon into simpler rectangular and/or triangular elements is calculated, and said windows are overlapped so that pairs of said simpler elements which have substantial potential coefficients between them that is more than de minimis are included together in at least one of said windows.

4. The method of claim 1, wherein at least some of said electrical conductors comprise non-rectangular and non-triangular multi-vertex polygons, further comprising the step of computing the division of each said multi-vertex polygon into respective pluralities of simpler geometric elements by:

extending a ray from a vertex of said multi-vertex polygon through the multi-vertex polygon to intersect an opposed segment of the multi-vertex polygon, defining the peripheries of said simpler geometric elements as comprising said ray and respective different portions of the periphery of said multi-vertex polygon, and wherein the parasitic capacitance values are determined for said simpler geometric elements, whereby said computing of parasitic capacitances is simplified and can be accomplished with increased speed.

5. The method of claim 4, wherein rays are extended from multiple vertices of said multi-vertex polygon to locate a vertex from which a ray extends through the interior of the multi-vertex polygon to intersect an opposed segment of the multi-vertex polygon, and said simpler geometric elements are defined from said located vertex.

6. The method of claim 5, wherein said elements are defined from a located vertex whose ray intersects an odd number of opposed segments of said multi-vertex polygon.

7. The method of claim 5, wherein rays are not extended from vertices that lie along overlapping segments of said multi-vertex polygon.

8. The method of claim 4, wherein a plurality of rays are extended from said vertex to intersect respective opposed segments of said multi-vertex polygon, the periphery of said multi-vertex polygon together with said rays establishing two outer geometric elements and at least one inner geometric element, the outer geometric elements being defined by respective rays and the portion of the multi-vertex polygon's periphery between said vertex and the respective intersection points of said rays, and the inner geometric elements being defined by respective pairs of successive rays and the portion of the multi-vertex polygon's periphery between the intersection points of said successive rays.

9. The method of claim 8, wherein said rays are extended from said vertex in an x,y coordinate pattern.

10. The method of claim 8, wherein a first one of said geometric elements is defined by progressing from said vertex along the periphery of said multi-vertex polygon to the intersection of a first ray and back along said ray to the vertex; subsequent geometric elements up to the last element are defined by progressing from said vertex along the ray for the previous element to the periphery of the multi-vertex polygon, along said periphery to the intersection of the next ray and back along said next ray to the vertex; and the last geometric element is defined by progressing from said vertex along the ray for the previous element to the periphery of the multi-vertex polygon, and along said periphery back to said vertex.

11. The method of claim 4, for use with electrically conductive multi-vertex polygons in generally parallel but mutually spaced planes in which an edge of a first conductive multi-vertex polygon in one plane is aligned with the interior of a second conductive multi-vertex polygon in the other plane, wherein said second conductive multi-vertex polygon is divided into geometric elements of which at least some have a common edge that lies along a projection of said first conductive polygon edge onto the second conductive multi-vertex polygon, with none of the interiors of said geometric elements traversed by said projected edge of the first conductive multi-vertex polygon.

12. The method of claim 11, in which said projected edge of the first conductive multi-vertex polygon extends only partially through the interior of said second conductive multi-vertex polygon, wherein said projected edge is extended to the periphery of said second conductive multi-vertex polygon in dividing said multi-vertex polygon into geometric elements.

13. The method of claim 1, further comprising the steps of generating a preliminary set of parasitic capacitance values between said multiple electrical conductors, storing said preliminary set of parasitic capacitance values in a storage element, substituting said computed parasitic capacitance values for said stored preliminary set of parasitic capacitance values in said storage element, and simulating said electrical circuit using said substituted parasitic capacitance values from said storage element.

14. A method of computing the division of an electrically conductive, multi-vertex polygon in an electrical circuit into a plurality of simpler geometric elements in order to facilitate the computation of parasitic capacitances within said electrical circuit by the method of partial capacitances, comprising:

establishing a mutually orthogonal x-y coordinate system extending a ray from a vertex of said polygon through the polygon in an x or y direction to intersect an opposed segment of the polygon, and thereby establish subpolygons of said poly on that are bounded in part by said ray, determining whether said subpolygons are all either triangles or Manhattan-oriented rectangles based upon said coordinate system, if said determination is positive, defining the peripheries of said simpler geometric elements as comprising said subpolygons, and if said determination is negative, extending at least one additional ray from at least one vertex of said polygon through respective subpolygons in an x or y direction to intersect respective opposed segments of the polygon and thereby establish additional subpolygons, bounded in part by their respective additional rays, until said polygon is divided into a set of subpolygons that are all either triangles or Manhattan-oriented rectangles based upon said x-y coordinate system.

15. The method of claim 14, wherein rays are extended from multiple vertices of said polygon to locate a vertex from which a ray extends through the interior of the polygon to intersect an opposed segment of the polygon, and said simpler geometric elements are defined from said located vertex.

16. The method of claim 15, wherein said elements are defined from a located vertex whose ray intersects an odd number of opposed segments of said polygon.

17. The method of claim 15, wherein rays are not extended from vertices that lie along overlapping segments of said polygon.

18. The method of claim 14, wherein a plurality of rays are extended from said vertex to intersect respective opposed segments of said polygon, the periphery of said polygon together with said rays establishing two outer geometric elements and at least one inner geometric element, the outer geometric elements being defined by respective rays and the portion of the polygon's periphery between said vertex and the respective intersection points of said rays, and the inner geometric elements being defined by respective pairs of successive rays and the portion of the polygon's periphery between the intersection points of said successive rays.

19. The method of claim 18, wherein rays are extended from said vertex in an x,y coordinate pattern.

20. The method of claim 18, wherein a first one of said geometric elements is defined by progressing from said vertex along the periphery of said polygon to the intersection of a first ray and back along said ray to the vertex; subsequent geometric elements up to the last element are defined by progressing from said vertex along the ray for the previous element to the periphery of the polygon, along said periphery to the intersection of the next ray and back along said next ray to the vertex; and the last geometric element is defined by progressing from said vertex along the ray for the previous element to the periphery of the polygon, and along said periphery back to said vertex.

21. The method of claim 15, for use with electrically conductive polygons in generally parallel but mutually spaced planes in which an edge of a first conductive polygon in one plane is aligned with the interior of a second conductive polygon in the other plane, wherein said second conductive polygon is divided into geometric elements of which at least some have a common edge that lies along a projection of said first conductive polygon edge onto the second conductive polygon, with none of the interiors of said geometric elements traversed by said projected edge of the first conductive polygon.

22. The method of claim 21, in which said projected edge of the first conductive polygon extends only partially through the interior of said second conductive polygon, wherein said projected edge is extended to the periphery of said second conductive polygon in dividing said polygon into geometric elements.

23. A method of designing and fabricating an electrical circuit, comprising the steps of:
producing a tentative electrical circuit design having a physical layout with a plurality of electrically conductive polygons in respective planes,
computing the parasitic capacitance between a first electrically conductive polygon in a first plane and a second electrically conductive polygon in a second plane that is generally parallel to but spaced from the first plane, in which an edge of the first polygon is aligned with the interior of the second polygon, by:
dividing said second conductive polygon into a plurality of geometric elements, with at least some of said geometric elements having a common edge that is aligned with said first conductive polygon edge, and none of the interiors of said geometric elements overlapping said first conductive polygon edge, and
determining separately for each of the geometric elements of said second conductive polygon, by the method of partial capacitances, the parasitic capacitance associated with said first conductive polygon and the geometric elements of said second conductive polygon,
adjusting said tentative circuit design to correct for any excessive computed parasitic capacitances, and
fabricating electrical circuits in accordance with said adjusted circuit design.

24. The method of claim 23, in which said projected edge of the first conductive polygon extends only partially through the interior of said second conductive polygon, wherein said projected edge is extended to the periphery of said second conductive polygon in dividing said polygon into geometric elements.

25. A computer programmed to compute parasitic capacitances between multiple electrical conductors within an electrical circuit that has a known physical layout, said computer comprising:
means for computing a division of the physical layout of said electrical circuit into a plurality of windows in which at least one of said windows overlays at least one other of said windows, with at least some of said windows including respective pluralities of electrical conductors and at least one of said overlaps including at least one pair of electrical conductors,
means for determining for each window, the parasitic capacitance values associated with the electrical conductors of that window by the method of partial capacitances, and
means for combining the parasitic capacitance values of said windows, and averaging the parasitic capacitance values of electrical conductor pairs included in a window overlap between the windows forming said overlap, to obtain a set of parasitic capacitances for said electrical circuit.

26. A computer programmed to compute the parasitic capacitance between a first electrically conductive polygon in a first plane and a second electrically conductive polygon in a second plane that is generally parallel to but spaced from the first plane, in which an edge of the first polygon is aligned with the interior of the second polygon, said computer comprising:
means for dividing said second conductive polygon into a plurality of geometric elements, with at least some of said geometric elements having a common edge that is aligned with said first conductive polygon edge, and none of the interiors of said geometric elements overlapping said first conductive polygon edge, and
means for determining separately for each of the geometric elements of said second conductive polygon, by the method of partial capacitances, the parasitic capacitance associated with said first conductive polygon and the geometric elements of said second conductive polygon.

27. A machine having a memory which contains data representing a set of parasitic capacitances between multiple electrical conductors within an electrical circuit that has a known physical layout, said data generated by the method of:
computing a division of the physical layout of said electrical circuit into a plurality of windows in which at least one of said windows overlays at least one other of said windows, with at least some of said windows including respective pluralities of electrical conductors and at least one of said overlaps including at least one pair of electrical conductors,
determining, for each window, the parasitic capacitance values associated with the electrical conductors of that window by the method of partial capacitances, and
combining the parasitic capacitance values of said windows, and averaging the parasitic capacitance values of electrical conductor pairs included in a window overlap between the windows forming said overlap.

28. A machine having a memory which contains data representing a set of parasitic capacitance between a first electrically conductive polygon in a first plane and a second electrically conductive polygon in a second plane that is generally parallel to but spaced from the first plane, in which an edge of the first polygon is aligned with the interior of the second polygon, said data generated by the method of:

dividing said second conductive polygon into a plurality of geometric elements, with at least some of said geometric elements having a common edge that is aligned with said first conductive polygon edge, and none of the interiors of said geometric elements overlapping said first conductive polygon edge, and determining separately for each of the geometric elements of said second conductive polygon, by the method of partial capacitances, the parasitic capacitance associated with said first conductive polygon and the geometric elements of said second conductive polygon.

29. A method of computing the division of electrically conductive, multi-vertex polygons in an electrical circuit into respective pluralities of simpler geometric elements in order to facilitate the computation of parasitic capacitances within said electrical circuit by the method of partial capacitances, for use with electrically conductive polygons in generally parallel but mutually spaced planes in which an edge of a first conductive polygon in one plane is aligned with the interior of a second conductive polygon in the other plane, comprising:

dividing said first conductive polygon into simpler geometric elements, and dividing said second conductive polygon into geometric elements of which at least some have a common edge that lies along a projection of said first conductive polygon edge onto the second conductive polygon, with none of the interiors of said second polygon's geometric elements traversed by said projected edge of the first conductive polygon.

* * * * *